(12) United States Patent
Choi et al.

(10) Patent No.: US 8,477,055 B2
(45) Date of Patent: Jul. 2, 2013

(54) RESISTOR DEVICES AND DIGITAL-TO-ANALOG CONVERTERS USING THE SAME

(75) Inventors: Hyun-sik Choi, Hwaseong-si (KR); Ho-jung Kim, Suwon-si (KR); Hyung-su Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 74 days.

(21) Appl. No.: 13/157,730

(22) Filed: Jun. 10, 2011

(65) Prior Publication Data

US 2012/0133538 A1    May 31, 2012

(30) Foreign Application Priority Data

Nov. 30, 2010   (KR) .................. 10-2010-0120615

(51) Int. Cl.
*H03M 1/66* (2006.01)

(52) U.S. Cl.
USPC ........................................ 341/144; 365/158

(58) Field of Classification Search
USPC ................... 341/144, 154; 365/158, 148, 226
See application file for complete search history.

(56) References Cited

U.S. PATENT DOCUMENTS

| 4,179,750 | A | 12/1979 | Quadri | |
| 6,225,933 | B1 | 5/2001 | Salter et al. | |
| 6,677,877 | B2 | 1/2004 | Johnson et al. | |
| 7,499,304 | B2* | 3/2009 | Scheuerlein et al. | 365/148 |
| 7,539,040 | B2* | 5/2009 | Tamai et al. | 365/148 |
| 8,164,937 | B2* | 4/2012 | Norman | 365/63 |
| 2003/0184460 | A1 | 10/2003 | Johnson et al. | |
| 2004/0114429 | A1* | 6/2004 | Ehiro et al. | 365/158 |
| 2008/0252378 | A1* | 10/2008 | Hughes | 330/284 |

FOREIGN PATENT DOCUMENTS

JP     2000-020634 A     1/2000

OTHER PUBLICATIONS

J. Li, et al., "Design Paradigm for Robust Spin—Torque Transfer Magnetic RAM (STT MRAM) From Circuit/Architecture Pespective," *IEEE Transactions on Very Large Scale Integration (VLSI) Systems*, vol. 18, No. 12, pp. 1710-1723 (Dec. 2010).

* cited by examiner

*Primary Examiner* — Peguy Jean Pierre
(74) *Attorney, Agent, or Firm* — Harness, Dickey & Pierce, P.L.C.

(57) ABSTRACT

A digital-to-analog converter (DAC) includes: a plurality of first controllers and a plurality of resistor devices. The plurality of first controllers are configured to be selectively switched on according to a received digital signal to control an analog signal according to the received digital signal. The plurality of resistor devices are respectively connected to the plurality of first controllers. The plurality of resistor devices include non-volatile memory devices.

21 Claims, 7 Drawing Sheets

RESISTOR DEVICES AND DIGITAL-TO-ANALOG CONVERTERS USING THE SAME

CROSS-REFERENCE TO RELATED APPLICATION(S)

This application claims priority under 35 U.S.C. 119 to Korean Patent Application No. 10-2010-0120615, filed on Nov. 30, 2010, in the Korean Intellectual Property Office, the entire contents of which are incorporated herein by reference.

BACKGROUND

1. Field

Example embodiments relate to resistor devices and digital-to-analog converters (DACs) including the same.

2. Description of the Related Art

Recently, market demands for more compact, more highly integrated semiconductor devices have been continuously increasing. Rather than realizing a resistor on a printed circuit board (PCB), the size of a semiconductor device is reduced using methods of forming a resistor on wafers using polysilicon.

SUMMARY

Example embodiments provide resistor devices having reduced area and digital-to-analog converters (DACs) including the same.

Example embodiments also provide resistor devices capable of more precisely controlling a resistance value and DACs including the same.

Additional aspects will be set forth in part in the description which follows and, in part, will be apparent from the description, or may be learned by practice of example embodiments.

At least one example embodiment provides a digital-to-analog converter (DAC) including: a plurality of first controllers configured to be selectively switched on according to a received digital signal and configured to control an analog signal corresponding to the digital signal; and a plurality of resistor devices respectively connected to the plurality of first controllers and including non-volatile memory devices.

According to at least some example embodiments, the DAC may generate the analog signal by allowing current to flow through the plurality of resistor devices according to the received digital signal and summing the flowing current. Alternatively, the DAC may generate the analog signal by applying a voltage to both terminals of each of the resistor devices and summing the applied voltage.

The plurality of resistor devices may be binary-weighted resistors in which a resistance of a first of the plurality of resistor devices may be about two times a resistance value of a second of the plurality of resistor devices. The first resistor device may include a resistor block having a plurality of non-volatile memory devices, and the second resistor device may include two resistor blocks connected in parallel with one another.

According to at least some example embodiments, a resistance value of a first of the plurality of resistor devices may be equal or substantially equal to a resistance value of a second of the plurality of resistor devices.

The digital signal may represent one or more binary and/or thermometer codes.

According to at least some example embodiments, the DAC may include an R-2R ladder network. The 2R component of the R-2R ladder network may include a resistor block having a plurality of non-volatile memory devices. The R component of the R-2R ladder network may include two resistor blocks connected in parallel with each other.

Each of the non-volatile memory devices may include at least one selected from the group including: a phase-change random access memory (PRAM) device, a magnetic random access memory (MRAM) device, a resistive random access memory (ReRAM) device, a ferroelectric random access memory (FRAM) device, a flash memory device, or the like.

According to at least some example embodiments, the DAC may further include: a first calibration unit configured to control resistance values of the plurality of resistor devices. The first calibration unit may include: a write voltage application circuit configured to apply a write voltage to the plurality of resistor devices; and a second controller configured to selectively connect the plurality of resistor devices and the write voltage application circuit.

At least one of the plurality of resistor devices may include a resistor block including a plurality of non-volatile memory devices. The plurality of non-volatile memory devices may be connected in parallel with one another. The plurality of non-volatile memory devices connected in parallel with one another may be connected in a matrix formation.

According to at least some example embodiments, the resistor block may include: a main resistor unit having a plurality of first non-volatile memory devices; and a calibration unit having a plurality of second non-volatile memory devices. The plurality of first non-volatile memory devices may be connected in parallel with the plurality of second non-volatile memory devices. The calibration unit may further include: a plurality of third controllers configured to control resistance values of the plurality of second non-volatile memory devices.

At least one other example embodiment provides a DAC configured to convert a digital signal into an analog signal. According to at least this example embodiment, the DAC includes: a plurality of first controllers configured to control a plurality of analog signal parts according to bits of a received digital signal; and a plurality of resistor devices respectively connected to the plurality of first controllers. At least one of the plurality of resistor devices includes a resistor block having a plurality of non-volatile memory devices connected to one another in a matrix formation.

According to at least some example embodiments, the DAC may further include a first calibration unit configured to control resistance values of the plurality of resistor devices. The first calibration unit may include: a write voltage application circuit configured to apply a write voltage to the plurality of resistor devices; and a second controller configured to selectively connect the plurality of resistor devices with the write voltage application circuit.

The resistor block may include: a main resistor unit having a plurality of first non-volatile memory devices; and a calibration unit having a plurality of second non-volatile memory devices. The calibration unit may further include a plurality of third controllers configured to respectively control resistance values of the plurality of second non-volatile memory devices.

At least one other example embodiment provides a resistor device used as a resistive load of a semiconductor circuit. According to at least this example embodiment, the resistor device includes: at least one resistor block having a plurality of first non-volatile memory devices connected to one another in parallel in a matrix and connected to a plurality of second non-volatile memory devices. The plurality of first non-volatile memory devices are also connected between first and second nodes of the semiconductor circuit, and directly to the first and second nodes.

According to at least some example embodiments, the resistor device may further include a plurality of controllers connected between the first and second nodes. The plurality of controllers may be configured to control resistance values of the plurality of second non-volatile memory devices.

BRIEF DESCRIPTION OF THE DRAWINGS

Example embodiments will become apparent and more readily appreciated from the following description of the accompanying drawings in which.

DETAILED DESCRIPTION

Example embodiments will now be described more fully with reference to the accompanying drawings, in which some example embodiments are shown. Example embodiments may, however, be embodied in many different forms and should not be construed as being limited to the example embodiments set forth herein; rather, these example embodiments are provided so that this disclosure will be thorough and complete, and will fully convey the pertinent concepts.

The terminology used herein is for describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof. As used herein, the term "and/or," includes any and all combinations of one or more of the associated listed items.

It will be understood that, although the terms 'first', 'second', 'third', etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing.

Figure 1:
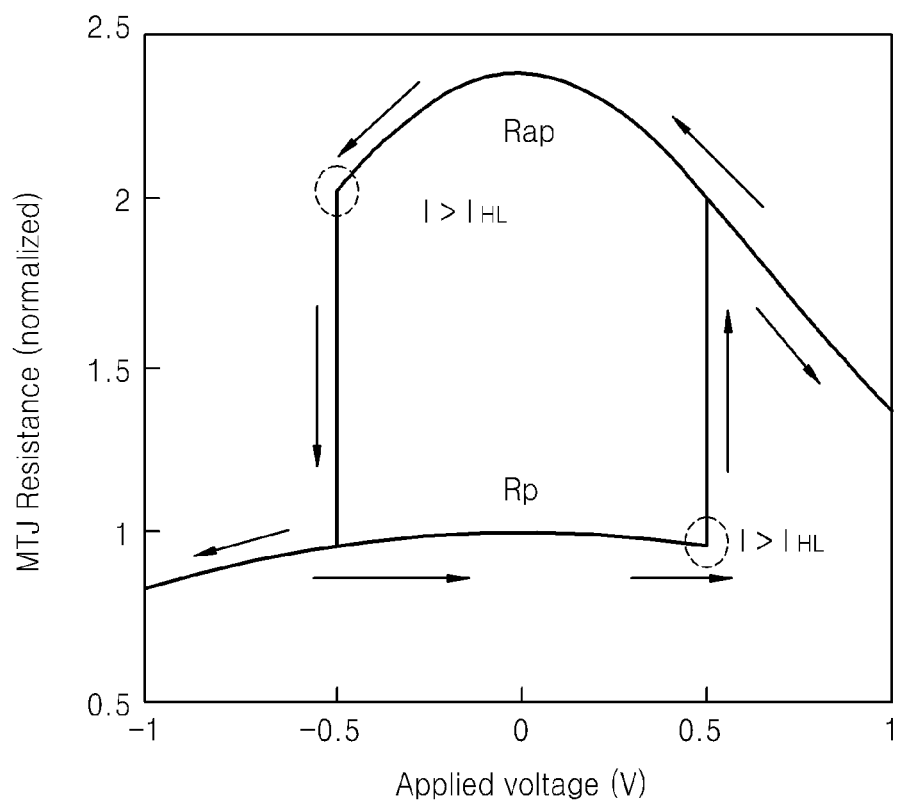
FIG. 1 is a graph illustrating resistance values of a non-volatile memory device included in a resistor device according to an example embodiment.

FIG. 1 is a graph illustrating a resistance value of a non-volatile memory device included in a resistor device according to an example embodiment.

According to at least some example embodiments, a resistor device may be realized using a non-volatile memory device, such as: a phase-change random access memory (PRAM), a magnetic random access memory (MRAM), a resistive random access memory (ReRAM), a ferroelectric random access memory (FRAM) or the like, which have different resistance values in a programmed state and in a non-programmed state.

Referring to FIG. 1, in one example, the resistor device may include a spin transfer torque (STT) MRAM device. As is known, an MRAM device has a resistance value that varies according to an applied voltage.

As shown in FIG. 1, in a parallel state the MRAM device has a resistance value Rp in response to an applied voltage between about −1 V about and about 0.5 V.

If a voltage greater than or equal to about 0.5 V is applied, then the current flowing in the MRAM device exceeds the value $I_{HL}$. In this case, the MRAM device changes from the parallel state to an anti-parallel state, and the resistance value of the MRAM device increases from resistance value Rp to a resistance value Rap. As shown in FIG. 1, the resistance value Rap is greater than the resistance value Rp.

If a voltage lower than about −0.5 V is applied to the MRAM device in the anti-parallel state, the current flowing in the MRAM device exceeds the value $I_{HL}$. In this case, the MRAM device changes from the anti-parallel state to the parallel state and the resistance of the MRAM device decreases from the resistance value Rap to the resistance value Rp.

A non-volatile memory device, such as an MRAM device having a fixed resistance value according to whether the MRAM device is in the parallel or anti-parallel state, maintains its resistance value. Therefore, the non-volatile memory device may be utilized as a resistive load in a semiconductor circuit. However, if the non-volatile memory device having a fluctuating resistance value is used as a resistor device, the semiconductor circuit may not be sufficiently stable.

Figure 2:
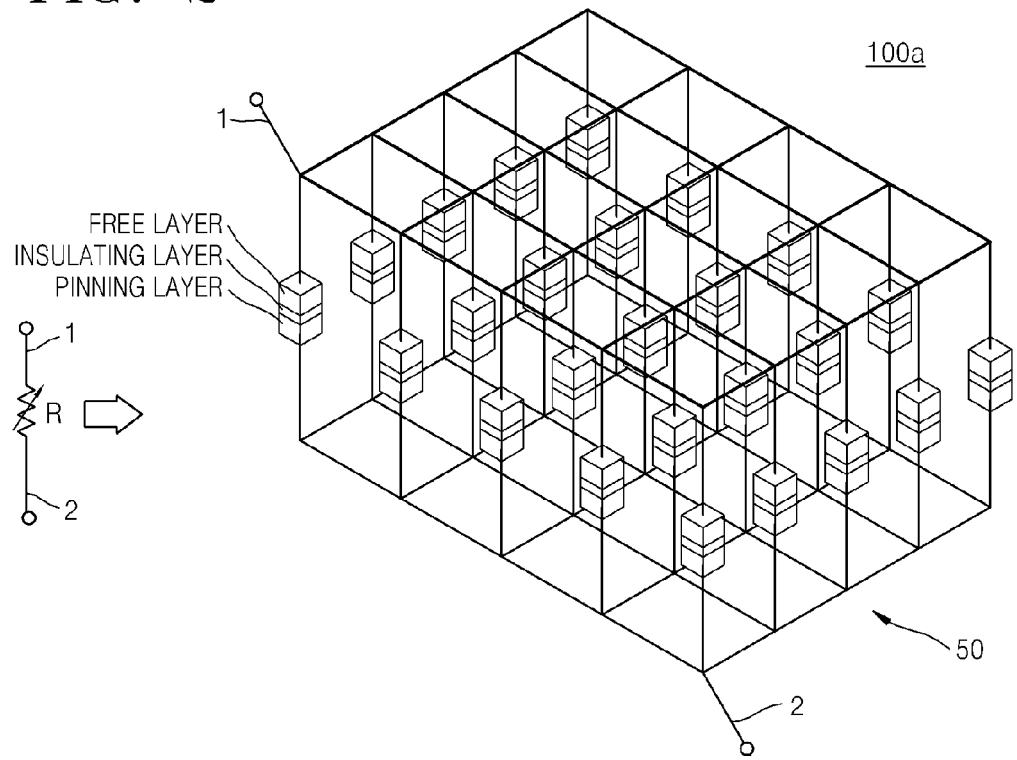
FIG. 2 is a perspective view illustrating a resistor device according to an example embodiment.
Figure 3:
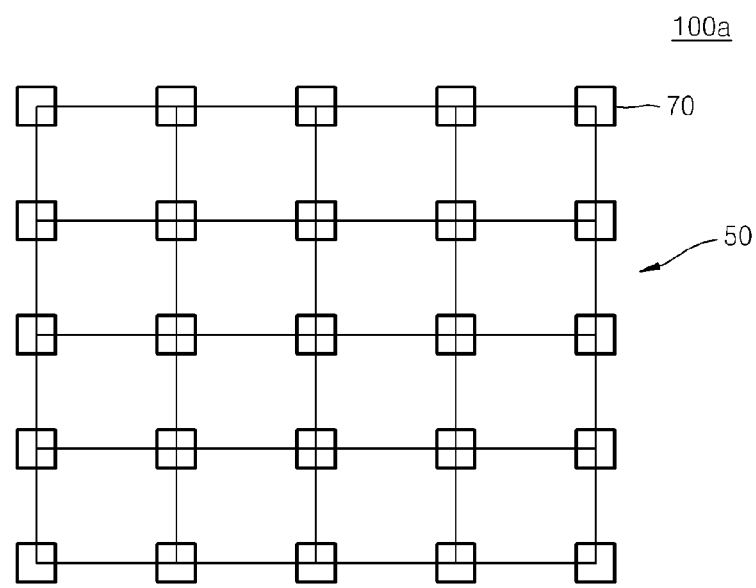
FIG. 3 is a plan view of the resistor device shown in FIG. 2.

FIG. 2 is a perspective view schematically illustrating a resistor device 100a according to an example embodiment. FIG. 3 is a plan view of the resistor device 100a.

Referring to FIGS. 2 and 3, the resistor device 100a includes at least one resistor block 50 connected between first and second nodes 1 and 2. The resistor block 50 includes a plurality of non-volatile memory devices 70 connected in parallel between nodes 1 and 2. In another example, the plurality of non-volatile memory devices 70 of the resistor block 50 may be connected to one another in a matrix form to reduce the area required for realization.

Although the non-volatile memory devices 70 in FIGS. 2 and 3 are shown as MRAM devices, example embodiments are not limited thereto. Rather, each of the plurality of non-volatile memory devices 70 may include at least one selected from the group including a PRAM device, an MRAM device, a ReRAM device, a FRAM device, a flash memory device, etc.

Still referring to FIGS. 2 and 3, each of the plurality of non-volatile memory devices 70 includes a free layer, an insulating layer, a pinning player, etc. The plurality of non-volatile memory devices 70 maintain constant or substantially constant resistance values, but the constant or substantially constant resistance values are relatively low due to their parallel connections. With regard to FIG. 1, for example, the resistance value Rap changes by about 2 kΩ from about 25 kΩ to about 27 kΩ according to the applied voltage. If 25 MRAM devices are connected to one another in parallel, the resistance value Rap changes from about 1 kΩ to about 1.08 kΩ according to an applied voltage. Therefore, a resistor device including the resistor block 50 having a resistance variation of about 80Ω may be obtained.

Figure 4:
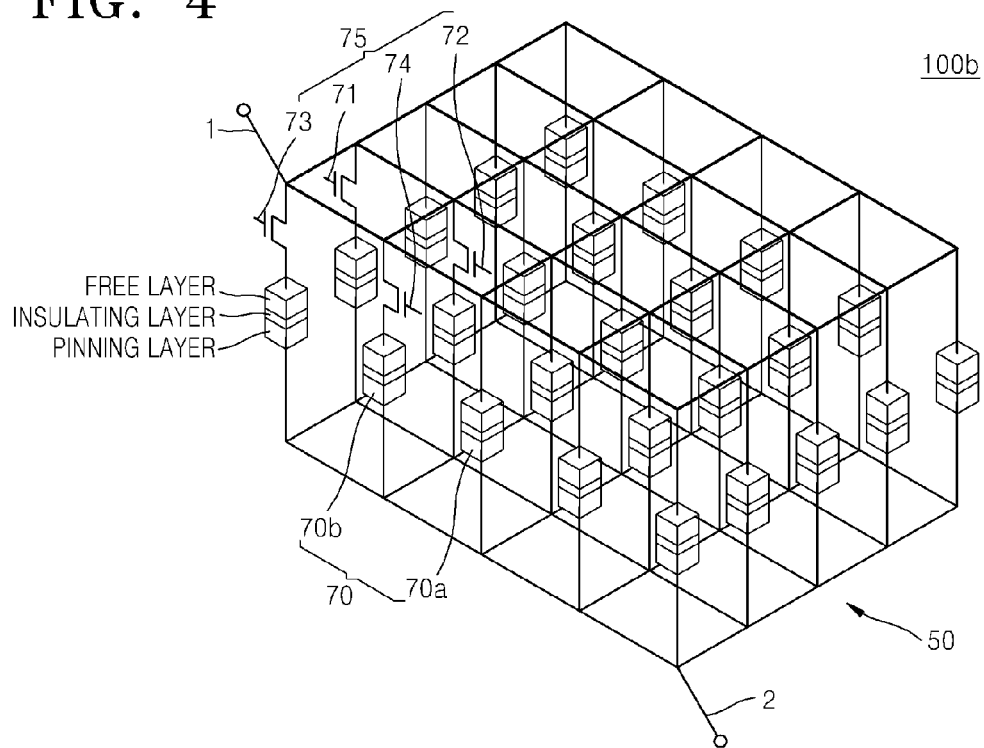
FIG. 4 is a perspective view illustrating a resistor device according to another example embodiment.
Figure 5:
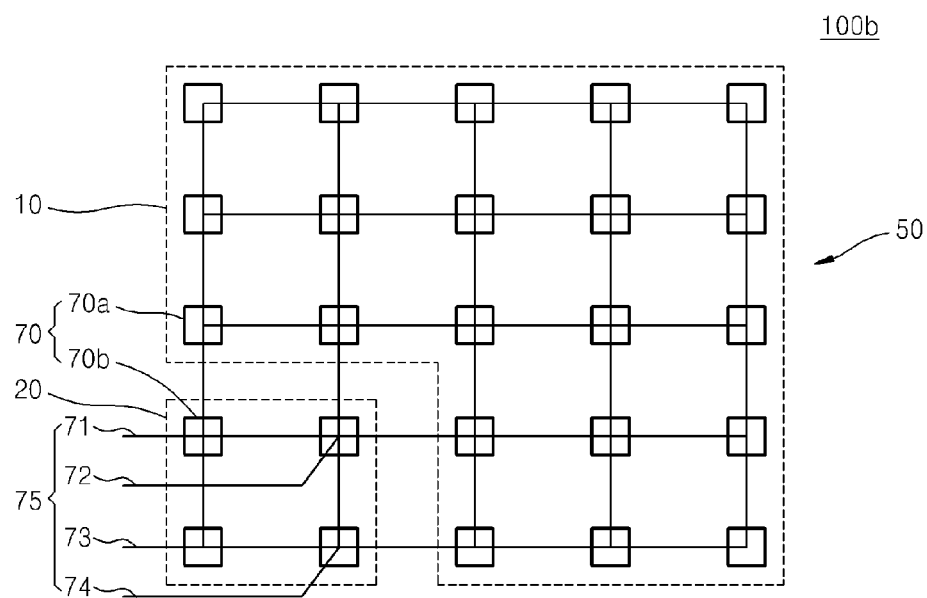
FIG. 5 is a plan view of the resistor device shown in FIG. 4.

FIG. 4 is a perspective view schematically illustrating a resistor device 100b according to an example embodiment. FIG. 5 is a plan view schematically illustrating the resistor device 100b shown in FIG. 4. The resistor device 100b is similar to the resistor device 100a discussed above with regard to FIGS. 2 and 3. Thus, descriptions of similar components are omitted.

Referring to FIGS. 4 and 5, the resistor device 100b includes a main resistor unit 10 and a calibration unit 20. The main resistor unit 10 and the calibration unit 20 are connected to each other in parallel. The main resistor unit 10 includes a plurality of resistors of resistor block 50. For example, the main resistor unit 10 includes a plurality of first non-volatile memory devices 70a connected to one another in parallel. The first non-volatile memory devices 70a of the main resistor unit 10 are connected (e.g., directly connected) between first and second nodes 1 and 2. In the example embodiment shown in FIGS. 4 and 5, resistance values of the first non-volatile memory devices 70a of the main resistor unit 10 may be changed simultaneously or concurrently by applying a write voltage between the first and second nodes 1 and 2.

Still referring to FIGS. 4 and 5, the calibration unit 20 includes a relatively small number of resistors of the resistor block 50. More specifically, for example, as shown, the calibration unit 20 includes a plurality of second non-volatile memory devices 70b connected to one another in parallel.

The second non-volatile memory devices 70b of the calibration unit 20 are also connected between the first and second nodes 1 and 2. The calibration unit 20 further includes a plurality of controllers 75 connected between the second non-volatile memory devices 70b and the first or second node 1 or 2. The controllers 75 may be transistors or similar switching devices.

Resistance values of the second non-volatile memory devices 70b of the calibration unit 20 may be changed simultaneously or concurrently by applying a write voltage between the first and second nodes 1 and 2. Alternatively, the write voltage may be applied through the controllers 75 to selectively change resistance values of the non-volatile memory devices 70b. In this example, the resistance values of the non-volatile memory devices 70b may be changed individually.

In FIG. 5, for example, the resistor block 50 includes 25 MRAM devices. Each of the 25 MRAM devices has a resistance value Rap of about 25 kΩ and is connected to one another in parallel. In this case, the resistor block 50 has a resistance value of about 1000Ω (or 1.00 kΩ).

Of the 25 MRAM devices in the resistor block 50, 21 first non-volatile memory devices 70a (e.g., MRAM devices) constitute the main resistor unit 10, and 4 second non-volatile memory devices 70b (e.g., MRAM devices) constitute the calibration unit 20.

To control a resistance value of the resistor block 50, a write voltage may be applied between the first and second nodes 1 and 2 to simultaneously or concurrently change the resistance values of the first non-volatile memory devices 70a and the second non-volatile memory devices 70b. For example, if a tunnel magnetic resistance (TMR) of a MRAM device is about 15%, a resistance value of the resistor block 50 changes from about 1000Ω in the anti-parallel state to about 850Ω in a parallel state.

Alternatively, the resistance value of the resistor block 50 may be controlled by selectively applying a voltage to the second non-volatile memory devices 70b through the controllers 75 of the calibration unit 20. In this case, the resistance values of the second non-volatile memory devices 70b may be changed individually. In one example, a state of a particular second non-volatile memory device 70b may be changed from an anti-parallel state to a parallel state by applying a voltage to that second non-volatile memory device 70b through a transistor. In one example, a resistance value Rp of the non-volatile memory device 70b in the parallel state may decrease to about 21.25 kΩ. As a result, a resistance value of the resistor block 50 may about 993Ω. As described above, the resistance value of the resistor block 50 may be changed in increments of about 7Ω by selectively changing states of the second non-volatile memory devices 70b.

Alternatively, the controllers 75 (e.g., transistors) may be used as switches. According to at least this example embodiment, rather than applying a voltage through the controllers (e.g., transistors) 75 to change the resistance value of the resistor block 50, the controllers 75 may be turned off to remove an electrical connection of one or more non-volatile memory devices to control the resistance value of the resistor block 50. In one example, if the electrical connection to one non-volatile memory device is removed, then 24 MRAM devices remain connected to one another in the resistor block 50. If each of the 24 MRAM devices is in the anti-parallel state having a resistance value Rap of about 25 kΩ, then the resistance value of the resistor block 50 is about 1040Ω. In this case, the resistance value of the resistor block 50 may be changed in increments of about 40Ω by removing or interrupting the voltage applied to the non-volatile memory devices.

As described above, the resistance value of the resistor device 100b is changed (e.g., slightly changed) and controlled (e.g., more precisely controlled) through the calibration unit 20. Also, an area of the resistor device 100b may be reduced more than a resistor device formed of polysilicon on a wafer, thereby contributing to reduced size and/or increased integration of a resistor device.

Figure 6:
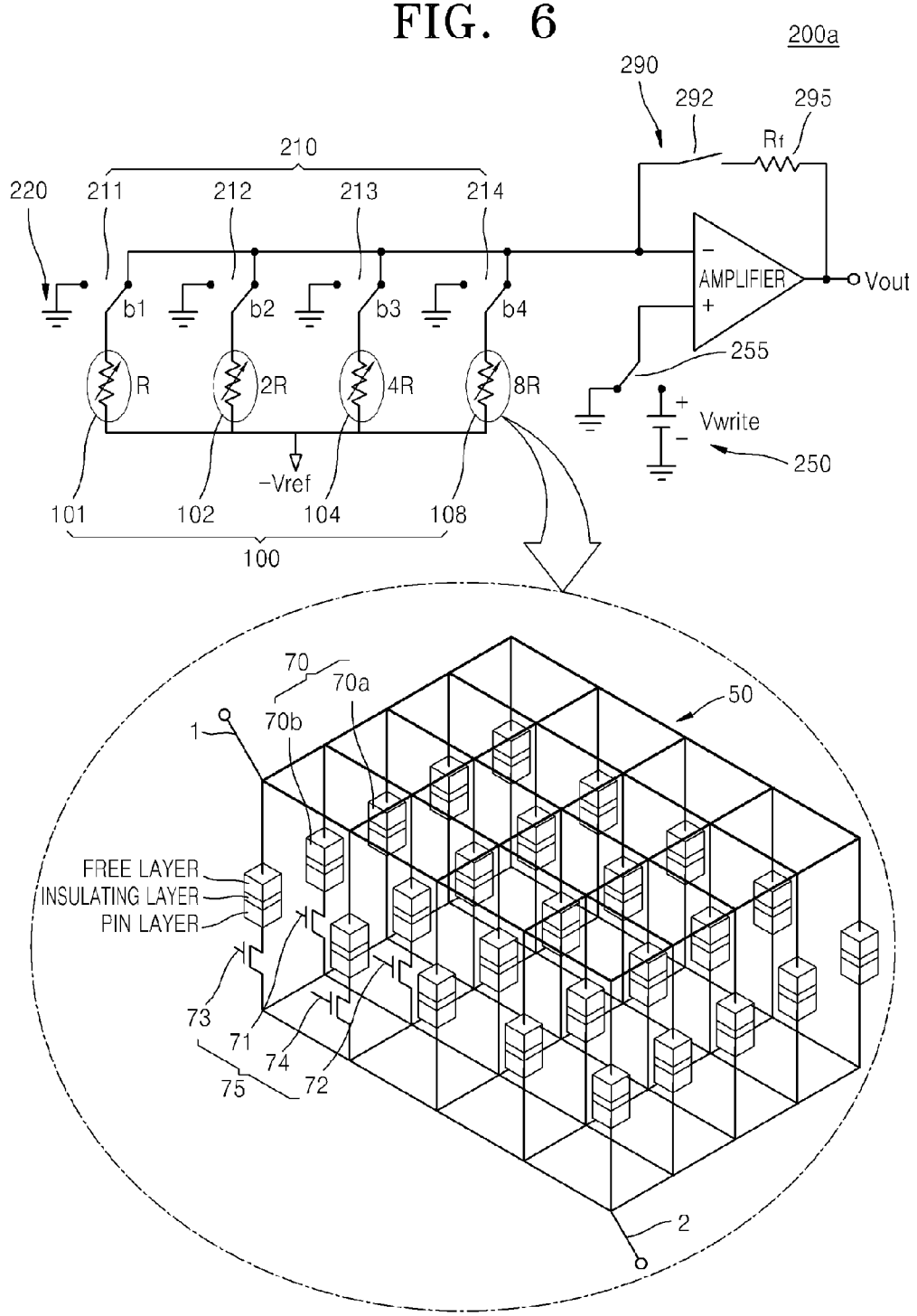
FIG. 6 is a circuit diagram schematically illustrating a digital-to-analog converter (DAC) according to an example embodiment.
Figure 7:
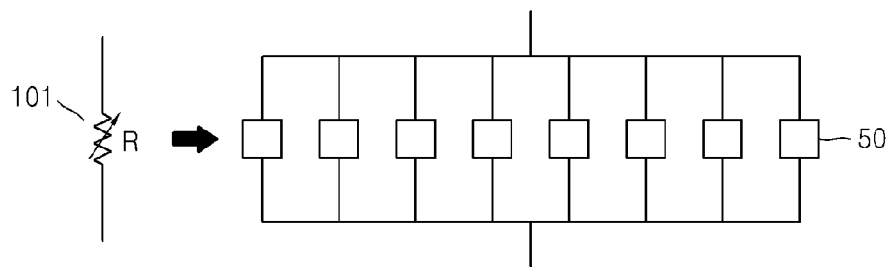
FIG. 7 is a view illustrating an example embodiment of a resistor device of the DAC of FIG. 6 in more detail.
Figure 7:
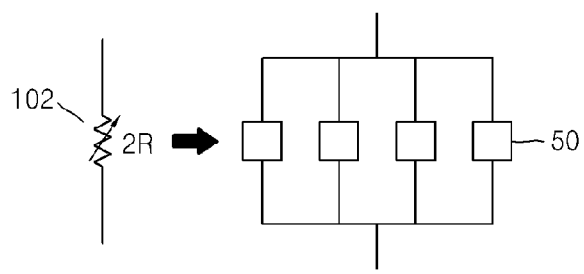
Figure 7:
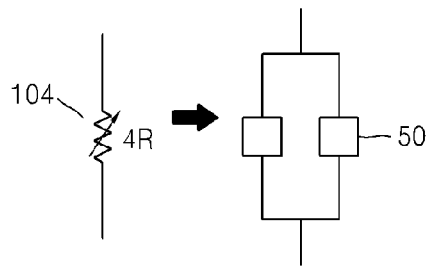
Figure 7:
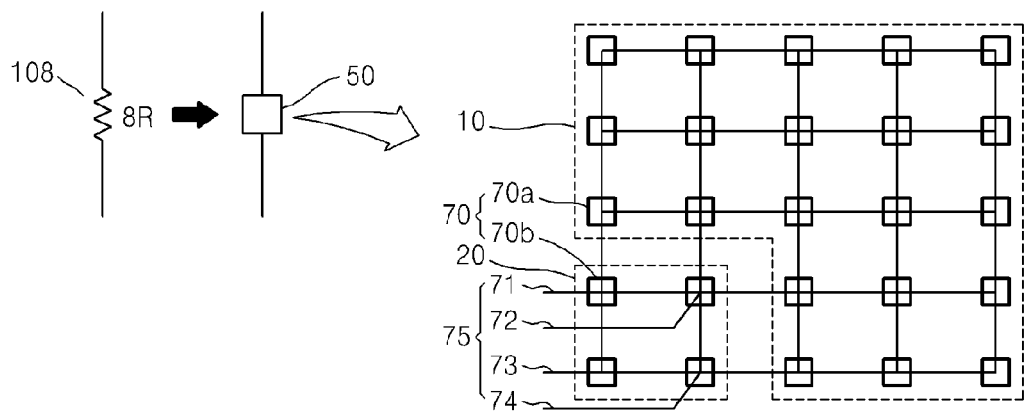

FIG. 6 is a circuit diagram schematically illustrating a digital-to-analog converter (DAC) 200a according to an example embodiment. FIG. 7 is a view illustrating a resistor device 100 of the DAC 200a in more detail. The DAC 200a may be formed using the resistor devices 100a and 100b of FIGS. 1 through 5, and thus, repetitive descriptions are omitted.

Referring to FIG. 6, the DAC 200a is configured to convert a digital signal into an analog signal. In more detail, the DAC 200a allows a current to flow in the resistor device 100 according to an applied digital signal and adds the flowing current to generate an analog signal.

As shown in FIG. 6, the DAC 200a includes a plurality of first controllers 210, a plurality of resistor devices 100 and a first calibration unit 250. The plurality of first controllers 210 includes first controllers 211, 212, 213 and 214. The plurality of resistor devices 100 includes resistor devices 101, 102, 103 and 104.

Although the DAC 200a shown in FIG. 6 is configured to generate an analog signal by adding currents, example embodiments are not limited thereto. The DAC 200a may be configured to apply a voltage to the resistor devices 100 and add voltage to generate an analog signal.

Still referring to FIG. 6, the plurality of first controllers 210 are switched (e.g., on and off) according to a digital signal to generate a corresponding analog signal. In more detail, each of the plurality of controllers 210 is configured to receive a respective one of a plurality of bits b1, b2, b3, and b4 of the digital signal. The plurality of controllers 210 are configured to control the analog signal output according to the bits b1, b2, b3, and b4. The analog signal may be currents flowing through the resistor devices 100 in response to an applied reference voltage −Vref.

In the example shown in FIG. 6, the plurality of controllers 210 transmit current to ground 220 when switched off, but transmit current to an output terminal 290 when switched on. As mentioned above, the plurality of controllers 210 are switched on an off based on the plurality of bits b1, b2, b3, and b4 of the input digital signal.

The plurality of resistor devices 100 are respectively connected between the plurality of controllers 210 and a source of the reference voltage −Vref. For example, the resistor device 101 is connected between controller 211 and the source of the reference voltage −Vref, the resistor device 102 is connected between controller 212 and the source of the reference voltage −Vref, the resistor device 103 is connected between controller 213 and the source of the reference voltage −Vref, and the resistor device 104 is connected between controller 214 and the source of the reference voltage −Vref. The plurality of resistor devices 100 may be binary-weighted resistors. According to at least some example embodiments, a resistance value of the resistor device 102 may be two times a resistance value of the resistor device 101, a resistance value of the resistor device 104 may be two times the resistance value of the resistor device 102, and a resistance value of the resistor device 108 may be two times the resistance value of the resistor device 104. That is, for example, the resistance values of the resistor devices 101, 102, 104, and 108 may be R, 2R, 4R, and 8R, respectively.

In FIG. 6, the resistor device 101 has the lowest resistance value from among the resistor devices 100. And, the first controller 211 is configured to receive the most significant bit (MSB) b1 of the applied digital signal. If the first controller 211 connects the reference voltage −Vref to the output terminal 290, then the reference voltage −Vref is applied, and a relatively high current is transmitted to an output resistor 295.

The resistor device 108 has the highest resistance value among the plurality of resistors 100. And, the first controller 214 is configured to receive the least significant bit (LSB) b4 of the applied digital signal. If the first controller 214 connects the reference voltage −Vref to the output terminal 290, then the reference voltage −Vref is applied, and a relatively low current is transmitted to the output resistor 295.

In the 4-bit DAC 200a shown in FIG. 6, the first controller 211 connects to the resistor device 101 having the lowest resistance value R in response to the MSB b1. If the MSB b1 is "1" (e.g., if the MSB b1 is at a relatively high level), then a current value "Vref/R=I" is transmitted to the output resistor 295. The first controller 214 connects to the resistor device 108 having the highest resistance value 8R in response to the LSB b4. In this case, if the LSB b4 is "1," then a current value "Vref/8R=I/8" is transmitted to the output resistor 295.

Because current values (e.g., 1 and I/8) as described above have analog current values corresponding to bits of a digital signal, a current value to which the current values are added is an analog current value corresponding to the digital signal. Because the analog current value corresponding to the digital signal is transmitted to the output resistor 295, the DAC 200a outputs an analog output voltage Vout corresponding to the digital signal.

In a more specific example, if the applied digital signal is "1001," the bits b1 and b4 are respectively "1" (or at relatively high levels), whereas the bits b2 and b3 are respectively "0" (or at relatively low levels). In this case, the current transmitted to the output resistor 295 is about "I+I/8=9I/8," and the analog output voltage Vout corresponding to the digital signal is about "9/8*I*Rf."

Still referring to FIG. 6, as mentioned above the ADC 200a also includes a first calibration unit or circuit 250. The first calibration unit or circuit 250 is configured to adjust the resistance values of the plurality of resistor devices 100.

In more detail, the first calibration unit 250 includes a write voltage application unit or circuit Vwrite and a second controller 255. The write voltage application unit or circuit Vwrite is configured to apply a write voltage to the plurality of resistor devices 100. The second controller 255 is configured to control electrical connections between the plurality of resistor devices 100 and the write voltage application unit Vwrite.

Although the write voltage application unit Vwrite is shown as a single voltage source in FIG. 6, the write voltage application unit Vwrite is not limited thereto. For example, if a flash memory device is used as a non-volatile memory device, then a resistance value of the non-volatile memory device may vary (e.g., continuously) with variations in a write voltage. In this case, the write voltage application unit Vwrite may be configured to continuously change a voltage applied to the flash memory device according to a control signal.

The first calibration unit 250 is connected to an input terminal (+) of an amplifier.

Still referring to FIG. 6, a switch 292 and the output resistor 295 are connected in series between the input terminal (−) and the output terminal Vout of the amplifier.

When the digital signal is converted into an analog signal, the second controller 255 electrically connects the input terminal (+) to a ground terminal, and the switch 292 is turned on to allow the current to flow through the output resistor 295. By contrast, when a write operation is performed, the second controller 255 electrically connects the write voltage application unit Vwrite to the input terminal (+), but the switch 292 is turned off. In this example, the write voltage is applied to the output terminal 290 connected to the input terminal (−) of the amplifier.

The write voltage application unit Vwrite may apply a voltage to the plurality of resistor devices 100 to simultaneously or concurrently change the resistance values of the plurality of resistor devices 100. In one example, resistance values of the resistor devices 100 shown in FIG. 6 in a parallel state are R, 2R, 4R, and 8R, respectively. In this example, the change rate of a TMR is assumed to be about 100%. In this case, as the write voltage application unit Vwrite applies the write voltage, the resistor devices 100 transition from the parallel state to an anti-parallel state, and the resistance values of the resistor devices 100 increase to about 2R, 4R, 8R, and 16R, respectively.

The write voltage application unit Vwrite may apply the write voltage to change resistances of the resistor devices 100, thereby achieving relatively high speed operation and/or relatively low power consumption. In more detail, for example, because a resistor-capacitor (RC) time constant of the resistor devices 100 decreases, the DAC 200a including the resistor devices 100 having relatively low resistance values (e.g., R, 2R, 4R, and 8R) in the parallel state operate at relatively high speeds. On the other hand, the DAC 200a including the resistor devices 100 having relatively high resistances (e.g., 2R, 4R, 8R, and 16R) in the anti-parallel state achieve reduced power consumption because current leakage into the resistor devices 100 decreases.

Each of the plurality of resistor devices 100 includes at least one resistor block 50 including a plurality of non-volatile memory devices 70. If the resistor device 108 including one resistor block 50 has a resistance value about two times a resistance value of the resistor device 104, then the resistor device 104 includes two resistor blocks 50 connected to each other in parallel.

In more detail, referring to FIG. 7, resistor blocks 50 having the same or substantially the same resistance value (e.g., 8R) may be connected to one another in parallel to realize the resistor devices 101, 102, 104, and 108 of the DAC 200a. In this example, the resistor device 108 includes one resistor block 50, the resistor device 104 includes two resistor blocks 50 connected in parallel, the resistor device 102 includes four resistor blocks 50 connected in parallel, and the resistor device 101 includes eight resistor blocks 50 connected in parallel. More generally, the n-bit DAC 200a may include $2^n-1$ resistor blocks 50.

The resistor block 50 of FIG. 6 may correspond to the resistor block 50 of FIGS. 2 through 5. For example, as described with regard to FIGS. 2 and 5, the plurality of non-volatile memory devices 70 may be connected to one another in parallel in a matrix form and may be grouped into a main resistor unit 10 and a second calibration unit 20.

As described in more detail with reference to FIGS. 4 and 5, the first non-volatile memory devices 70a of the main resistor unit 10 are connected to second non-volatile memory devices 70b of the second calibration unit 20 in parallel between first and second nodes 1 and 2. The first non-volatile memory devices 70a of the main resistor unit 10 are connected (e.g., directly connected) between the first and second nodes 1 and 2. The second calibration unit 20 further includes a plurality of third controllers 75 configured to selectively control electrical connections between the plurality of second non-volatile memory devices 70b and the first controllers 210 shown in FIG. 6.

In one example, 25 MRAM devices 70, each having a resistance value of about 25 kΩ, may be connected to one another in parallel to realize the resistor device 108 (of FIG. 6). As discussed above, a current flows through the resistor device 108 according to the LSB b4 of an input digital signal. In more detail, 25 MRAM devices may be connected to one another in parallel in a 5×5 matrix to form one resistor block 50. In this example, a resistance value of the resistor block 50 is about 1 kΩ ("8R=1 kΩ") in the DAC 200a.

As described above, in example embodiments the resistance value of the resistor block 50 is controlled relatively precisely. For example, a voltage may be applied to the second non-volatile memory devices 70b through the third controllers 75 of the second calibration unit 20 to change resistance values of the second non-volatile memory devices 70b and/or control electrical connections of the second non-volatile memory devices 70b through the third controllers 75. Accordingly, the resistance value of the resistor block 50 may be controlled relatively precisely.

Because the resistance value of the resistor block 50 is controlled relatively precisely, the conversion accuracy of the DAC 200a may improve. Integral non-linearity (INL) and differential non-linearity of the DAC 200a before and after adjustment are compared through a simulation as shown in Table 1 below.

TABLE 1

|  | Before Adjustment | After Adjustment |
|---|---|---|
| INL | 0.35 LSB | 0.19 LSB |
| DNL | 0.4 LSB | 0.2 LSB |

Accordingly, the resistance values of the plurality of non-volatile memory devices 70 may be changed simultaneously or concurrently through the first calibration unit 250 to realize the DAC 200a with reduced power consumption and/or higher operating speeds. Also, the DAC 200a may change the resistance values of the plurality of non-volatile memory devices 70 individually through the second calibration unit 20 to control the resistance value of the resistor block 50 more precisely, thereby more accurately converting a digital signal into a corresponding analog signal.

Figure 8:
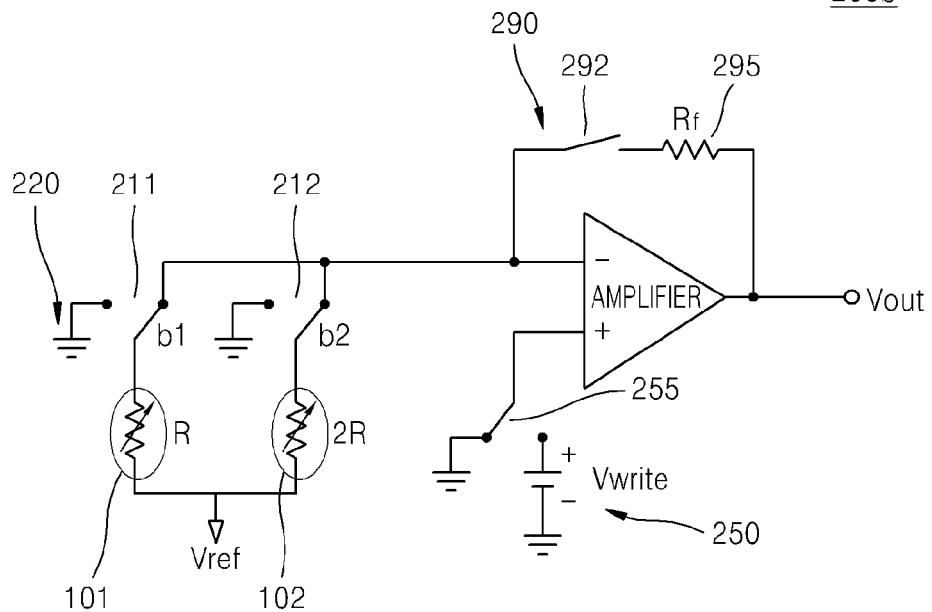
FIG. 8 is a circuit diagram schematically illustrating a DAC according to an example embodiment.
Figure 9:
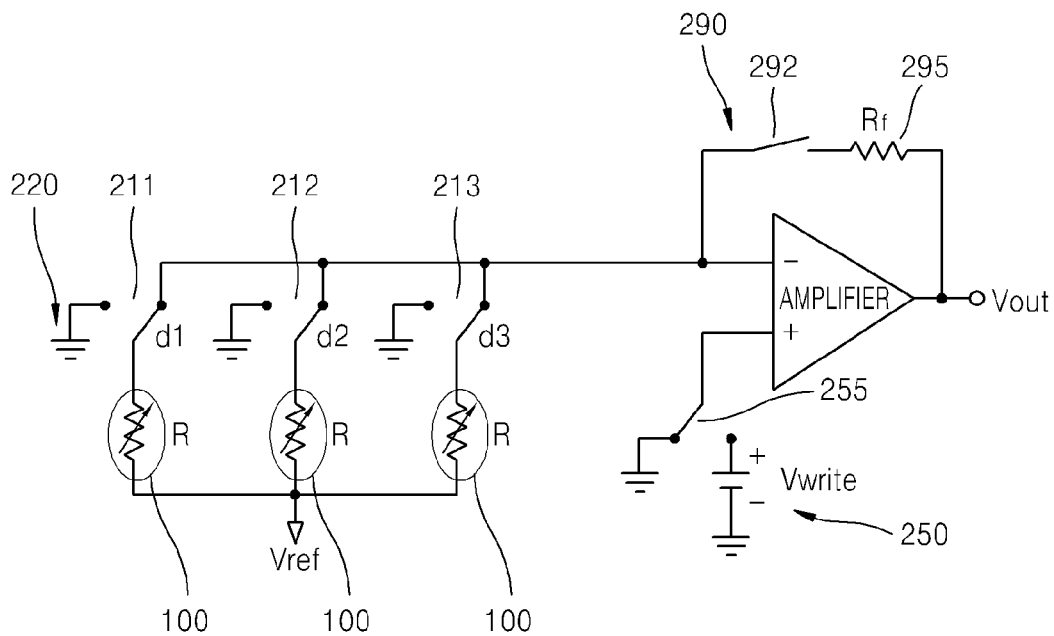
FIG. 9 is a circuit diagram schematically illustrating a DAC according to another example embodiment.

FIG. 8 is a circuit diagram schematically illustrating a DAC 200b according to an example embodiment. FIG. 9 is a circuit diagram schematically illustrating a DAC 200c according to another example embodiment. The DACs 200b and 200c are similar to the DAC 200a of FIG. 7, and thus, repetitive descriptions of similar components are omitted.

Referring to FIG. 8, the DAC 200b is configured to receive a binary signal (or codes) and convert the binary signal into an analog signal. The DAC 200c of FIG. 9 is configured to receive thermometer codes and convert the thermometer codes into an analog signal. Although not shown in FIG. 8, the DAC 200b may include a decoder for converting the binary code into a thermometer code.

Table 2 shows a comparison between signals input into the DAC 200b of FIG. 8 and signals input into the DAC 200c of FIG. 9.

TABLE 2

| Decimal Number | Input Signals of FIG. 8 (b1, b2) | Input Signals of FIG. 9 (d1, d2, d3) |
|---|---|---|
| 0 | 00 - (0, 0) | 000 - (0, 0, 0) |
| 1 | 01 - (0, 1) | 001 - (0, 0, 1) |
| 2 | 10 - (1, 0) | 011 - (0, 1, 1) |
| 3 | 11 - (1, 1) | 111 - (1, 1, 1) |

In the DAC 200b of FIG. 8, the digital input signal is a binary code, and thus, resistance values of resistor devices 101 and 102 of the DAC 200b are weighted as binary numbers to convert the digital input signal into an analog signal.

In the DAC 200c of FIG. 9, the digital input signal is a thermometer code, and thus, resistance values of resistor devices 100 of the DAC 200c are equal or substantially equal to one another to convert the digital input signal into an analog signal.

If binary codes are expressed as $2^n$ pieces of analog data using bit signals input from n input terminals, thermometer codes are expressed as $2^n$ pieces of analog data using bit signals input through $2^n-1$ input terminals. For example, bit signals b1 and b2 are received from two (n) input terminals to express binary codes of the DAC 200b of FIG. 8 as four ($2^n$) pieces of analog data. Bit signals d1, d2, and d3 are received from three ($2^n-1$) input terminals to express thermometer codes of the DAC 200c of FIG. 9 as four ($2^n$) pieces of analog data.

Figure 10:
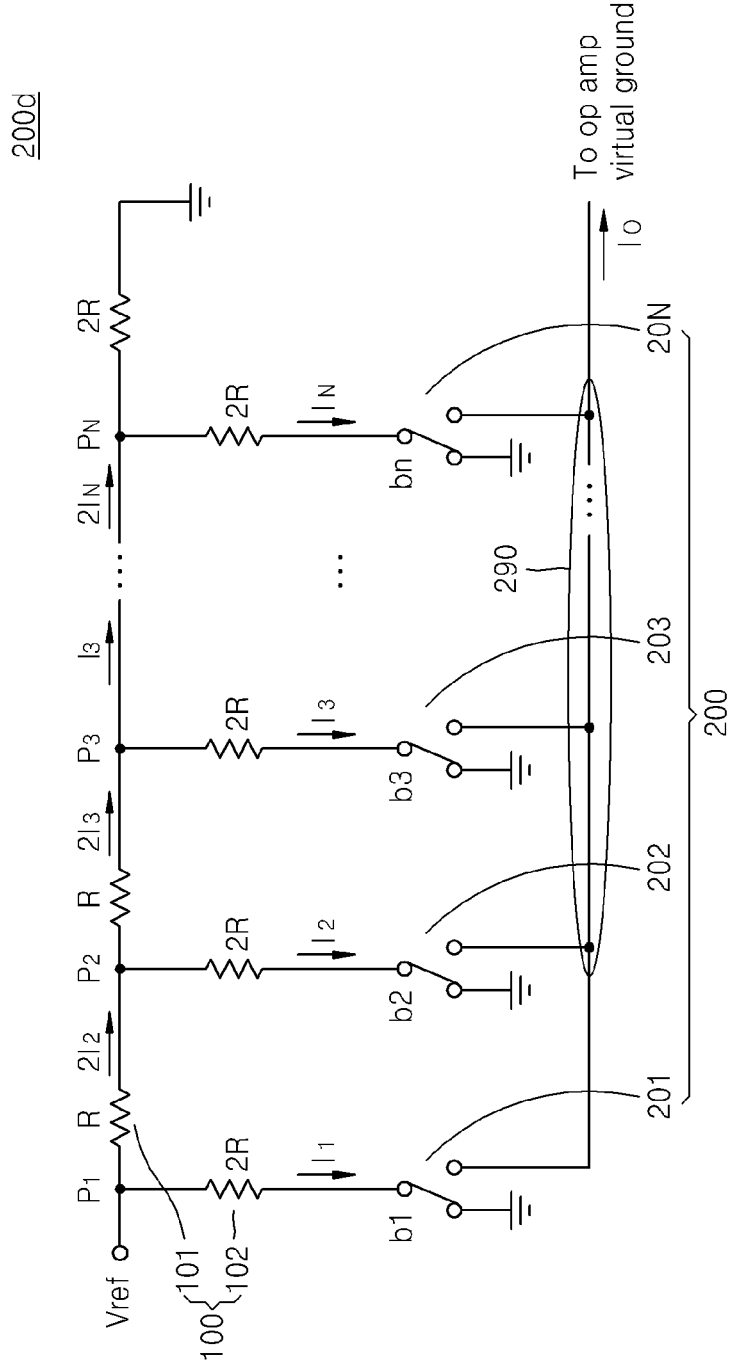
FIG. 10 is a circuit diagram schematically illustrating a DAC according to yet another example embodiment.

FIG. 10 is a circuit diagram schematically illustrating a portion of a DAC 200*d* according to another example embodiment. The DAC 200*d* is similar to the DAC 200*a* of FIG. 6, and thus, repetitive descriptions are omitted.

Referring to FIG. 10, the DAC 200*d* is configured to convert a digital signal into an analog signal. In this example, the DAC 200*d* is configured as an R-2R ladder network. The resistance value between each of ladder points $P_1, P_2, P_3, \ldots P_N$ is R, whereas the resistance value between each of the ladder points $P_1, P_2, P_3, \ldots PN$ and ground is 2R. Therefore, a first current flowing from one of ladder points $P_1, P_2, P_3, \ldots P_N$ to the right is equal or substantially equal to the second current flowing from the same ladder point to ground. For example, the first current $2I_2$ is equal or substantially equal to the second current $I_1$, the first current $2I_3$ is equal or substantially equal to the second current $I_2$, etc.

In FIG. 10, the current flowing from the left side of a ladder point is equal or substantially equal to the sum of the first and second currents output from the ladder point, and thus, the current flowing from the left side of the ladder point has a current value about two times the first or second current. Therefore, currents flowing through respective resistor devices 100 are about two times the difference there between and become an analog signal corresponding to a digital signal.

In example operation, to generate an analog signal according to a digital signal, a plurality of first controllers 200 (including first controllers 201, 202, 203, ... 20N) receive respective bit signals b1, b2, b3, ..., bn of a digital signal and transmit the current flowing in resistor devices 102 to ground or an output terminal 290 according to the bit signals b1, b2, b3, ..., bn. In this example, resistance values of the resistor devices 102 of the plurality of resistor devices 100 connected to the first controllers 200 may be equal or substantially equal to one another.

The R-2R ladder network includes resistor devices 102 and resistor devices 101. Each of the resistor devices 102 has a resistance value of 2R, whereas each of the resistor devices 101 has a resistance value R. Each of the resistor devices 100 may include one or more resistor blocks 50. In the example shown in FIG. 10, each resistor device 102 having the resistance value of 2R may include one resistor block 50, whereas each resistor device 101 having the resistance value R may include two resistor blocks 50 connected in parallel with one another.

Example embodiments may be applied to various types of DACs, for example, the DACs 200*a*, 200*b*, 200*c*, and 200*d* shown in FIGS. 6, 8, 9, and 10, respectively. In these examples, the DACs 200*a* and 200*b* may include resistor devices having binary-weighted resistance values, the DAC 200*c* may include resistor devices having the same or substantially the same resistance values and may use thermometer codes, and the DAC 200*d* may include resistor devices having the same or substantially the same resistance values and may use an R-2R ladder network.

Resistor devices applied to the DACs 200*a*, 200*b*, 200*c*, and 200*d* are only example embodiments, and thus, may be used as resistive loads of other semiconductor circuits.

As described above, according to the one or more of the above example embodiments, a DAC may simultaneously or concurrently change resistance values of a plurality of non-volatile memory devices of a resistor device through a first calibration unit to operate at lower power and/or higher speeds.

In addition, DACs according to at least some example embodiments may selectively change the resistance values of the plurality of non-volatile memory devices through a second calibration unit to more precisely adjust a resistance value of the resistor device, thereby more accurately converting a digital signal into a corresponding analog signal.

Shapes of elements shown in the attached drawings may be construed as examples for clear understanding of this disclosure; the elements may be modified into various shapes. Like reference numerals in the drawings denote like elements.

While example embodiments have been particularly shown and described with reference to the drawings, it will be understood that various changes in form and details may be made therein without departing from the spirit and scope of the following claims.

What is claimed is:

1. A digital-to-analog converter (DAC) comprising:
a plurality of first controllers configured to be selectively switched on according to a received digital signal to control an analog signal corresponding to the digital signal; and
a plurality of resistor devices respectively connected to the plurality of first controllers, the plurality of resistor devices including non-volatile memory devices;
wherein the DAC generates the analog signal by allowing a current to flow through the plurality of resistor devices according to the received digital signal and summing the current, or by applying a voltage to terminals of each of the plurality of resistor devices and summing the applied voltage.

2. The DAC of claim 1, wherein the plurality of resistor devices are binary-Weighted resistors in which a resistance of a first resistor device of the plurality of resistor devices is about two times a resistance of a second resistor device of the plurality of resistor devices.

3. The DAC of claim 2, wherein the first resistor device includes a resistor block having a plurality of non-volatile memory devices, and the second resistor device includes two resistor blocks connected in parallel with one another.

4. The DAC of claim 1, wherein a resistance value of a first resistor device of the plurality of resistor devices is substantially equal to a resistance value of a second resistor device of the plurality of resistor devices.

5. The DAC of claim 4, wherein the received digital signal represents a thermometer code.

6. The DAC of claim 4, wherein the DAC includes an R-2R ladder network.

7. The DAC of claim 6, wherein a 2R component of the R-2R ladder network includes a resistor block having a plurality of non-volatile memory devices, and an R component of the R-2R ladder network includes two resistor blocks connected in parallel with one another.

8. The DAC of claim 1, wherein each of the non-volatile memory devices includes at least one of a phase-change random access memory (PRAM) device, a magnetic random access memory (MRAM) device, a resistive random access memory (ReRAM) device, a ferroelectric random access memory (FRAM) device, and a flash memory device.

9. The DAC of claim 1, further comprising:
a first calibration unit configured to control resistance values of the plurality of resistor devices.

10. The DAC of claim 9, wherein the first calibration unit comprises:
a write voltage application circuit configured to apply a write voltage to the plurality of resistor devices; and
a second controller configured to control electrical connections between the plurality of resistor devices and the write voltage application circuit.

11. The DAC of claim 1, wherein at least one of the plurality of resistor devices comprises:

a resistor block including a plurality of the non-volatile memory devices.

12. The DAC of claim 11, wherein the plurality of non-volatile memory devices are connected in parallel with one another.

13. The DAC of claim 12, wherein the plurality of non-volatile memory devices connected in parallel with one another are connected to one another in a matrix.

14. The DAC of claim 11, wherein the resistor block comprises:
   a main resistor unit including a plurality of first non-volatile memory devices; and
   a calibration unit including a plurality of second non-volatile memory devices.

15. The DAC of claim 14, wherein the plurality of first non-volatile memory devices are connected in parallel with the plurality of second non-volatile memory devices.

16. The DAC of claim 14, wherein the calibration unit further includes:
   a plurality of third controllers configured to control resistance values of the plurality of second non-volatile memory devices.

17. A digital-to-analog converter (DAC) configured to convert a digital signal into an analog signal, the DAC comprising:
   a plurality of first controllers configured to control a plurality of analog signal parts according to a plurality of bits of a received digital signal; and
   a plurality of resistor devices respectively connected to the plurality of first controllers; wherein
      at least one of the plurality of resistor devices includes a resistor block having a plurality of non-volatile memory devices connected to one another in a matrix.

18. The DAC of claim 17, further comprising:
   a first calibration unit configured to control resistance values of the plurality of resistor devices; wherein the first calibration unit includes,
      a write voltage application circuit configured to apply a write voltage to the plurality of resistor devices; and
      a second controller configured to control electrical connections between the plurality of resistor devices and the write voltage application circuit.

19. The DAC of claim 17, wherein the resistor block comprises:
   a main resistor unit including a plurality of first non-volatile memory devices; and
   a calibration unit including a plurality of second non-volatile memory devices and a plurality of third controllers; wherein
      the plurality of third controllers are configured to control resistance values of respective ones of the plurality of second non-volatile memory devices.

20. A resistor device of a semiconductor circuit, comprising:
   at least one resistor block including a plurality of first non-volatile memory devices connected in parallel with one another and connected to a plurality of second non-volatile memory devices; wherein
      the plurality of first non-volatile memory devices are connected between first and second nodes of the semiconductor circuit, and
      the plurality of second non-volatile memory devices are directly connected to the first and second nodes of the semiconductor circuit.

21. The resistor device of claim 20, further comprising:
   a plurality of controllers connected between the first and second nodes; wherein the plurality of controllers are configured to control resistance values of respective ones of the plurality of second non-volatile memory devices.

* * * * *